United States Patent
Maruyama et al.

(10) Patent No.: US 11,005,429 B2
(45) Date of Patent: May 11, 2021

(54) CURRENT AMPLIFIER

(71) Applicant: MITSUBISHI ELECTRIC CORPORATION, Tokyo (JP)

(72) Inventors: Takaya Maruyama, Tokyo (JP); Koji Tsutsumi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/485,889

(22) PCT Filed: Mar. 23, 2017

(86) PCT No.: PCT/JP2017/011754
§ 371 (c)(1),
(2) Date: Aug. 14, 2019

(87) PCT Pub. No.: WO2018/173201
PCT Pub. Date: Sep. 27, 2018

(65) Prior Publication Data
US 2020/0021252 A1    Jan. 16, 2020

(51) Int. Cl.
*H03F 3/45*  (2006.01)
*H03F 1/32*  (2006.01)
*H03F 1/02*  (2006.01)

(52) U.S. Cl.
CPC .......... *H03F 1/3211* (2013.01); *H03F 1/0211* (2013.01); *H03F 1/3205* (2013.01);
(Continued)

(58) Field of Classification Search
CPC .......... H03F 3/45; H03F 1/086; H03F 1/3211
(Continued)

(56) References Cited

U.S. PATENT DOCUMENTS 3,760,197 A * 9/1973 Dann .................... H03B 5/1256
327/331
5,525,930 A * 6/1996 Pothast .................... H03F 1/083
330/252

(Continued)

FOREIGN PATENT DOCUMENTS

JP    8-330861 A    12/1996

OTHER PUBLICATIONS

International Search Report, issued in PCT/JP2017/011754, dated Jun. 13, 2017.
(Continued)

*Primary Examiner* — Steven J Mottola
(74) *Attorney, Agent, or Firm* — Birch, Stewart, Kolasch & Birch, LLP

(57) ABSTRACT

A first transistor, a second transistor, a third transistor, and a fourth transistor, their source terminals being grounded, are provided. Further, a first feedback circuit connected between a gate terminal and a drain terminal in the first transistor, and having first impedance, a second feedback circuit connected between a gate terminal and a drain terminal in the second transistor, and having the first impedance, a current source for outputting a current, a first load circuit connected between the drain terminal of the first transistor and a first output terminal of the current source, and having second impedance, and a second load circuit connected between the drain terminal of the second transistor and a second output terminal of the current source, and having the second impedance are provided.

6 Claims, 12 Drawing Sheets

(52) U.S. Cl.
CPC ..... *H03F 3/45085* (2013.01); *H03F 3/45183* (2013.01); *H03F 2200/129* (2013.01); *H03F 2200/301* (2013.01); *H03F 2200/451* (2013.01); *H03F 2203/45288* (2013.01); *H03F 2203/45528* (2013.01); *H03F 2203/45638* (2013.01)

(58) Field of Classification Search
USPC .................................................. 330/253, 261
See application file for complete search history.

(56) References Cited

U.S. PATENT DOCUMENTS

| | | |
|---|---|---|
| 5,712,594 A | 1/1998 | Kimura |
| 2007/0046374 A1 | 3/2007 | Kim |

OTHER PUBLICATIONS

Sahota et al., "High Dynamic Range Variable-Gain Amplifier for CDMA Wireless Applications," in Digest of Technical Papers—IEEE International Solid-State Circuits Conference, 1997, vol. 40, pp. 374-375.

* cited by examiner

CURRENT AMPLIFIER

TECHNICAL FIELD

The present invention relates to a current amplifier.

BACKGROUND ART

In an amplifier used in, for example, a transceiver for moving object, high linearity is required.

In Nonpatent Literature 1 mentioned later, a current amplifier including a first differential pair having two transistors, and a second differential pair having two transistors is disclosed.

This current amplifier includes a first current source connected between a source terminal of each of the two transistors that form the first differential pair, and ground, and a second current source connected between a source terminal of each of the two transistors that form the second differential pair, and the ground. The gain of this current amplifier is proportional to the ratio of a current outputted from the first current source and a current outputted from the second current source.

Further, in this current amplifier, a feedback resister is connected between the gate terminal and the drain terminal in each of the two transistors that form the first differential pair.

In this current amplifier, because the feedback resisters are connected, distortion in the dynamic range of a gate-to-source voltage in the two transistors that form the first differential pair is reduced. Namely, the distortion in the dynamic range of the gate-to-source voltage, the distortion being caused by the first differential pair, is reduced.

Because, as a result of the reduction in the distortion in the dynamic range, substantially the same voltage is applied to the first differential pair and the second differential pair, so that the linearity of the current amplifier is improved.

CITATION LIST

Nonpatent Literature

Non Patent Literature 1: G. S. Sahota and C. J. Persico, "High dynamic range variable-gain amplifier for CDMA wireless applications," in Digest of Technical Papers—IEEE International Solid-State Circuits Conference, 1997, vol. 40, pp. 374-375.

SUMMARY OF INVENTION

Technical Problem

In the conventional current amplifier, because the second current source is connected between the source terminal of each of the two transistors that form the second differential pair, and the ground, a voltage occurs between both terminals of the second current source. When a voltage occurs between both the terminals of the second current source, due to the influence of that voltage, the peak amplitude of a voltage at each of the drain terminals of the two transistors that form the second differential pair becomes small. When the peak amplitude of the voltage at each of the drain terminals becomes small, the linearity degrades, and the linearity further degrades with increase in the decrease amount of the peak amplitude.

Namely, the conventional current amplifier has a problem that even though the distortion in the dynamic range of the gate-to-source voltage in the two transistors that form the first differential pair is reduced by using the above-mentioned feedback resister, the linearity still degrades.

The present invention is made in order to solve the above-mentioned problem, and it is therefore an object of the present invention to provide a current amplifier that can eliminate the second current source connected between the source terminal of each of the two transistors that forma second differential pair, and ground, thereby preventing degradation in linearity.

Solution to Problem

A current amplifier according to the present invention includes: a first transistor whose source terminal is grounded and whose gate terminal is configured to receive a first signal; a second transistor whose source terminal is grounded and whose gate terminal is configured to receive a second signal, the first signal and the second signal mutually constituting a differential signal; a third transistor whose source terminal is grounded, whose drain terminal is connected to a first output terminal, and whose gate terminal is configured to receive the first signal; a fourth transistor whose source terminal is grounded, whose drain terminal is connected to a second output terminal, and whose gate terminal is configured to receive the second signal; a first feedback circuit connected between the gate terminal and a drain terminal which are included in the first transistor, and having first impedance; a second feedback circuit connected between the gate terminal and a drain terminal which are included in the second transistor, and having the first impedance; a current source outputting a current; a first load circuit connected between the drain terminal of the first transistor and an output terminal of the current source, and having second impedance; and a second load circuit connected between the drain terminal of the second transistor and the output terminal of the current source, and having the second impedance. A differential inductor having a center tap terminal is used as the first load circuit and the second load circuit. The center tap terminal of the differential inductor is connected to the output terminal of the current source, a first input/output terminal of the differential inductor is connected to the drain terminal of the first transistor, and a second input/output terminal of the differential inductor is connected to the drain terminal of the second transistor.

Advantageous Effects of Invention

According to the present invention, because the configuration as described above is provided, the second current source connected between the source terminal of each of the two transistors that form a second differential pair and ground is not required. As a result, there is provided an effect of preventing degradation in linearity.

DESCRIPTION OF EMBODIMENTS

Hereafter, for explaining the present invention in greater detail, some embodiments of the present invention will be described with reference to the accompanying drawings.

Embodiment 1

Figure 1:
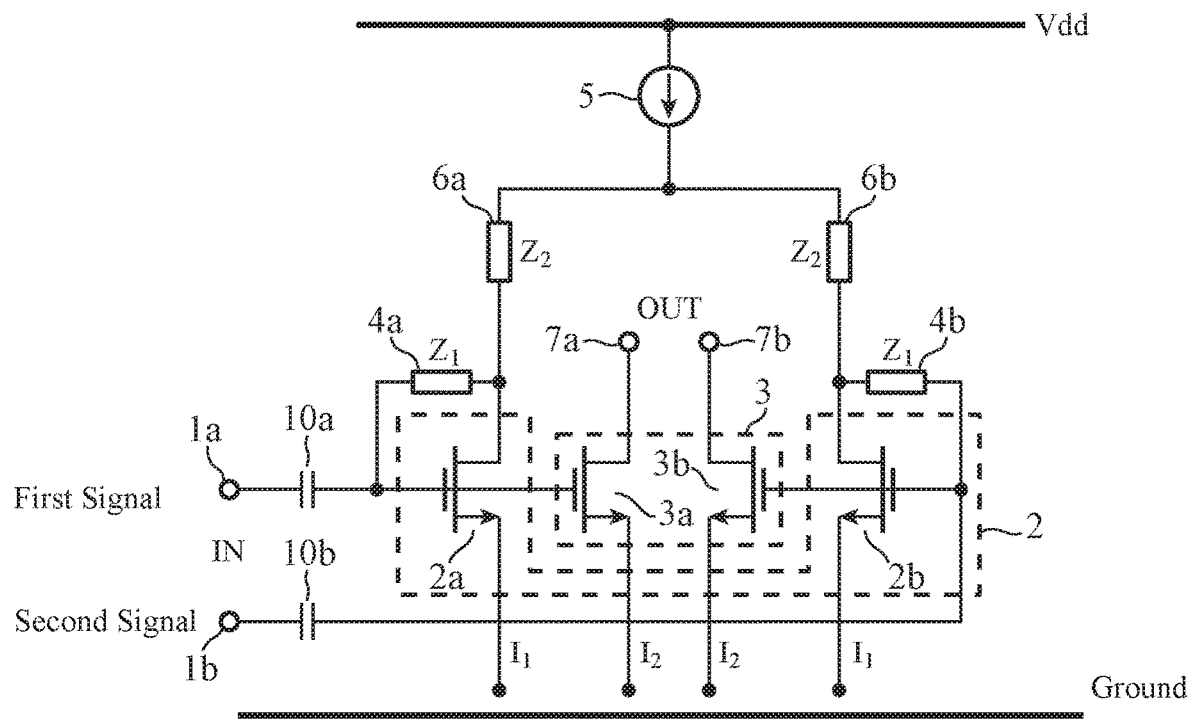
FIG. 1 is a schematic diagram showing a current amplifier according to Embodiment 1 of the present invention.

FIG. 1 is a schematic diagram showing a current amplifier according to Embodiment 1 of the present invention.

In FIG. 1, an input terminal 1*a* is a terminal to which a first signal is inputted.

An input terminal 1*b* is a terminal to which a second signal forming a differential signal with the first signal is inputted.

In this Embodiment 1, an electric potential difference between the first signal inputted from the input terminal 1*a* and the second signal inputted from the input terminal 1*b* is referred to as an input voltage IN.

A first differential pair 2 includes a first transistor 2*a* and a second transistor 2*b*.

The first transistor 2*a* and the second transistor 2*b* are, for example, field effect transistors such as MOS (Metal Oxide Semiconductor) transistors.

A source terminal of the first transistor 2*a* is grounded, and a gate terminal of the first transistor 2*a* is connected to the input terminal 1*a*. The first signal is provided to the gate terminal of the first transistor 2*a*.

A source terminal of the second transistor 2*b* is grounded, and a gate terminal of the first transistor 2*b* is connected to the input terminal 1*b*. The second signal is provided to the gate terminal of the second transistor 2*b*.

A second differential pair 3 includes a third transistor 3*a* and a fourth transistor 3*b*.

The third transistors 3*a* and the fourth transistor 3*b* are, for example, field effect transistors such as MOS transistors.

A source terminal of the third transistor 3*a* is grounded, a gate terminal of the third transistor 3*a* is connected to the input terminal 1*a*, and a drain terminal of the third transistor 3*a* is connected to a first output terminal 7*a*. The first signal is provided to the gate terminal of the third transistor 3*a*.

A source terminal of the fourth transistor 3*b* is grounded, a gate terminal of the fourth transistor 3*b* is connected to the input terminal 1*b*, and a drain terminal of the fourth transistor 3*b* is connected to a second output terminal 7*b*. The second signal is provided to the gate terminal of the fourth transistor 3*b*.

A first feedback circuit 4*a* is connected between the gate terminal and a drain terminal in the first transistor 2*a*, and has first impedance $Z_1$.

A second feedback circuit 4*b* is connected between the gate terminal and a drain terminal in the second transistor 2*b*. The second feedback circuit 4*b* has the first impedance $Z_1$ as impedance being the same characteristics as the first impedance $Z_1$ that the first feedback circuit 4*a* has.

Although it is assumed that the first feedback circuit 4*a* and the second feedback circuit 4*b* are implemented by, for example, resistors, as long as the feedback circuits have the first impedance $Z_1$, it does not matter what circuit configuration the feedback circuits have.

A current source 5 has an input terminal and an output terminal. The input terminal of the current source 5 is connected to a power source line having a voltage $V_{dd}$.

A first load circuit 6*a* is connected between the drain terminal of the first transistor 2*a* and the output terminal of the current source 5, and has second impedance $Z_2$.

A second load circuit 6*b* is connected between the drain terminal of the second transistor 2*b* and the output terminal of the current source 5. The second load circuit 6*b* has the second impedance $Z_2$ as impedance being the same characteristics as the second impedance $Z_2$ that the first load circuit 6*a* has.

Although it is assumed that the first load circuit 6*a* and the second load circuit 6*b* are implemented by, for example, resistors, as long as the load circuits have the second impedance $Z_2$, it does not matter what circuit configuration the load circuits have.

The first output terminal 7*a* is a terminal from which the first signal amplified by the first transistor 2*a* and the third transistor 3*a* is outputted.

The second output terminal 7*b* is a terminal from which the second signal amplified by the second transistor 2*b* and the fourth transistor 3*b* is outputted.

A capacitor 10*a* is a capacitive component that blocks a DC component included in the first signal inputted from the input terminal 1*a*.

A capacitor 10*b* is a capacitive component that blocks a DC component included in the second signal inputted from the input terminal 1*b*.

In this Embodiment 1, a current outputted from the first output terminal 7*a* and a current outputted from the second output terminal 7*b* are referred to as output currents $I_{OUT}$.

Next, operations will be explained.

A bias is applied between the gate and the source of each of the first transistor 2*a* and the second transistor 2*b* that form the first differential pair 2 by the current outputted from the current source 5.

The first signal inputted from the input terminal 1*a* and whose DC component is blocked by the capacitor 10*a* is provided to the gate terminal of the first transistor 2*a*. The second signal inputted from the input terminal 1*b* and whose DC component is blocked by the capacitor 10*b* is provided to the gate terminal of the second transistor 2*b*.

Thus, at the drain terminal of the second transistor 2*a*, a voltage amplitude corresponding to the first signal appears due to the second impedance $Z_2$ that the first load circuit 6*a* has.

Further, at the drain terminal of the second transistor 2*b*, a voltage amplitude corresponding to the second signal appears due to the second impedance $Z_2$ that the second load circuit 6*b* has.

The voltage amplitude corresponding to the first signal is fed back to the gate terminal of the first transistor 2*a* by the first feedback circuit 4*a*.

Further, the voltage amplitude corresponding to the second signal is fed back to the gate terminal of the second transistor 2b by the second feedback circuit 4b.

The linearity of the drain current of the first transistor 2a with respect to the first signal inputted from the input terminal 1a is improved through the feedback action of the voltage amplitude corresponding to the first signal.

Further, the linearity of the drain current of the second transistor 2b with respect to the second signal inputted from the input terminal 1b is improved through the feedback action of the voltage amplitude corresponding to the second signal.

The drain current of the third transistor 3a that forms the second differential pair 3 is amplified in proportion to the transistor size ratio of the third transistor 3a and the first transistor 2a.

Further, the drain current of the fourth transistor 3b that forms the second differential pair 3 is amplified in proportion to the transistor size ratio of the fourth transistor 3b and the second transistor 2b.

Conventionally, there exists a current amplifier in which the first differential pair 2 is not disposed and a second differential pair 3 is connected directly to the input terminals 1a and 1b. In the current amplifier of this Embodiment 1, the linearity of the output currents $I_{OUT}$ with respect to the input voltage IN from the input terminals 1a and 1b is improved in comparison with that of the conventional current amplifier.

Figure 2:
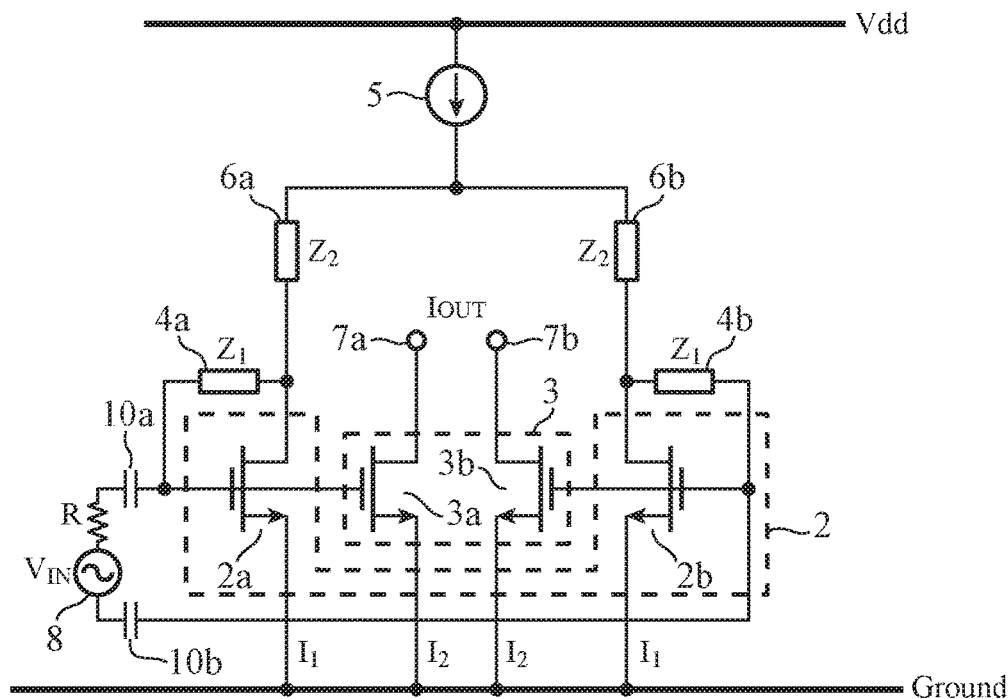
FIG. 2 is an explanatory drawing showing an example in which an input signal source 8 is connected between an input terminal 1a and an input terminal 1b in the current amplifier of FIG. 1.

FIG. 2 is an explanatory drawing showing an example in which an input signal source 8 is connected between the input terminal 1a and the input terminal 1b shown in the current amplifier of FIG. 1.

In FIG. 2, $V_{IN}$ denotes the voltage amplitude of the input signal source 8 connected between the input terminal 1a and the input terminal 1b, and $R_s$ denotes the output impedance of the input signal source 8. $I_{OUT}$ denotes the current outputted from the first output terminal 7a and the second output terminal 7b.

When the transconductance of each of the first and second transistors 2a and 2b is denoted by $g_{m1}$, the transconductance $G_m$ in the current amplifier of FIG. 2 is expressed as shown in the following equation (1).

$$G_m = \frac{I_{OUT}}{V_{IN}} = \frac{-1}{R_S} \times \frac{\frac{R_S Z_1}{R_S + Z_1} \times g_{m1}}{1 + \left(\frac{Z_1 Z_2}{Z_1 + Z_2} \times g_{m1} \times \frac{R_S}{R_S + Z_1}\right)} \times \frac{I_2}{I_1} \quad (1)$$

In equation (1), $I_1$ denotes a current flowing between the drain and the source in each of the first and second transistors 2a and 2b, and $I_2$ denotes a current flowing between the drain and the source in each of the third and fourth transistors 3a and 3b.

In equation (1), the transconductance $g_{m1}$ in each of the first and second transistors 2a and 2b exhibits nonlinearity.

However, as shown in the following equation (2), when $Z_1$, $Z_2$, $g_{m1}$ and $R_s$ are set in such a way that the second term of the denominator in equation (1) becomes sufficiently larger than 1, $g_{m1}$ in the numerator of equation (1) and $g_{m1}$ in the denominator of equation (1) can be canceled approximately. As a result, the transconductance $G_m$ exhibits linearity.

$$\text{Second Term of Denominator in Equation (1)} = \quad (2)$$
$$\left(\frac{Z_1 Z_2}{Z_1 + Z_2} \times g_{m1} \times \frac{R_S}{R_S + Z_1}\right) \gg 1$$

As is clear from the above description, according to this Embodiment 1, the following components are included: a first transistor whose source terminal is grounded and whose gate terminal is configured to receive a first signal; a second transistor whose source terminal is grounded and whose gate terminal is configured to receive a second signal, the first signal and the second signal mutually constituting a differential signal; a third transistor whose source terminal is grounded, whose drain terminal is connected to a first output terminal, and whose gate terminal is configured to receive the first signal; a fourth transistor whose source terminal is grounded, whose drain terminal is connected to a second output terminal, and whose gate terminal is configured to receive the second signal; a first feedback circuit 4a connected between the gate terminal and a drain terminal which are included in the first transistor 2a, and having first impedance $Z_1$; a second feedback circuit 4b connected between the gate terminal and a drain terminal which are included in the second transistor 2b, and having the first impedance $Z_1$; a current source 5 outputting a current; a first load circuit 6a connected between the drain terminal of the first transistor 2a and an output terminal of the current source 5, and having second impedance $Z_2$; and a second load circuit 6b connected between the drain terminal of the second transistor 2b and the output terminal of the current source 5, and having the second impedance $Z_2$. As a result, a second current source connected between the ground and each of the source terminal of the third transistor 3a and the source terminal of the fourth transistor 3b is not required, and there is provided an effect of being able to avoid degradation in the linearity.

Namely, according to this Embodiment 1, in each of the third and fourth transistors 3a and 3b, the source terminal is grounded, and no current source is connected between the source terminal and the ground. Therefore, in the current amplifier of this Embodiment 1, the peak amplitude of the voltage of the drain terminal in each of the third and fourth transistors 3a and 3b does not become small due to the influence of a current source, and degradation in the linearity does not occur, unlike in the case of the current amplifier described in Nonpatent Literature 1. Therefore, the linearity can be improved comparing with than that of the current amplifier described in Nonpatent Literature 1.

Embodiment 2

In this Embodiment 2, a current amplifier that includes, as first and second load circuits, a differential inductor 9 having a center tap terminal 9a will be explained.

FIGS. 10-13 illustrate the schematic diagrams if FIGS. 2, 4, 6 and 8 that include a differential inductor 9 as discussed above.

Figure 3:
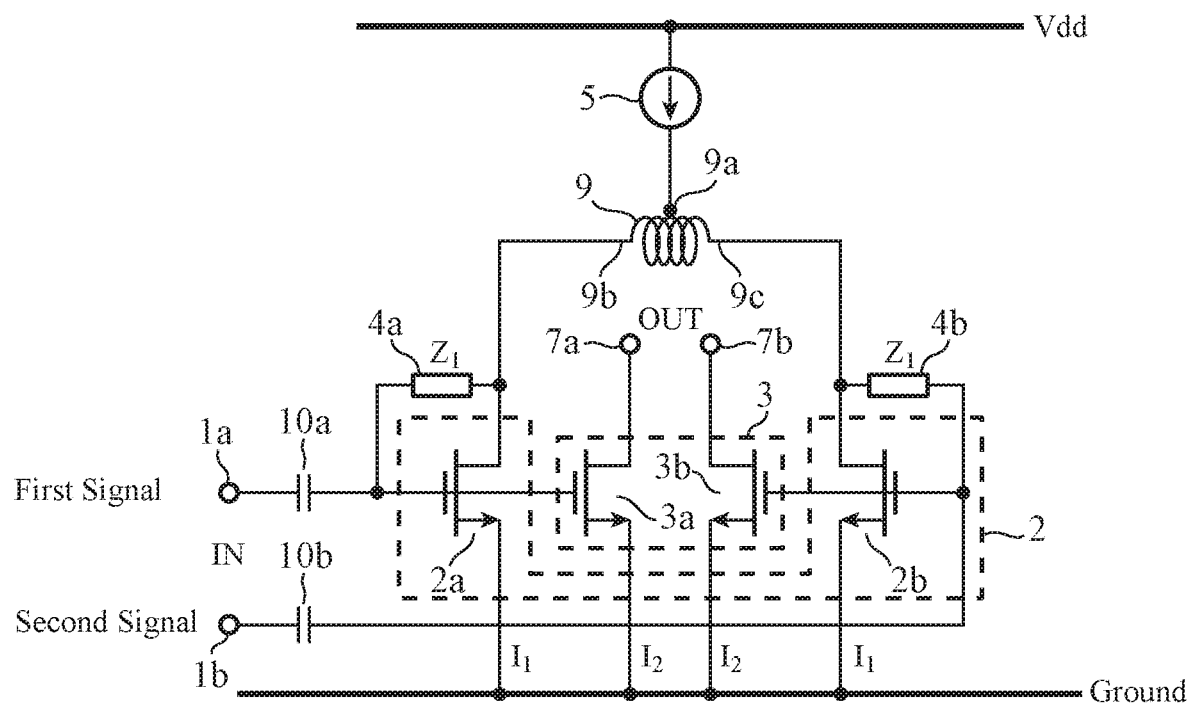
FIG. 3 is a schematic diagram showing a current amplifier according to Embodiment 2 of the present invention.

FIG. 3 is a schematic diagram showing the current amplifier according to Embodiment 2 of the present invention. In FIG. 3, because the same reference characters as those shown in FIG. 1 denote the same or corresponding components, an explanation of the components will be omitted hereafter.

The differential inductor 9 has the center tap terminal 9a.

The center tap terminal 9a of the differential inductor 9 is connected to an output terminal of a current source 5, a first input/output terminal 9b of the differential inductor 9 is connected to a drain terminal of a first transistor 2a, and a second input/output terminal 9c of the differential inductor 9 is connected to a drain terminal of a second transistor 2b.

A part of the differential inductor 9 extending from the center tap terminal 9a to the first input/output terminal 9b has second impedance $Z_2$, like the first load circuit 6a of FIG. 1.

Further, a part of the differential inductor 9 extending from the center tap terminal 9a to the second input/output terminal 9c has the second impedance $Z_2$, like the second load circuit 6b of FIG. 1.

Due to such a configuration, the differential inductor 9 operates in the same way as the first load circuit 6a and the second load circuit 6b of FIG. 1.

In above-described Embodiment 1, in a case in which noise signals are inputted as in-phase signals from the input terminals 1a and 1b, a voltage corresponding to the in-phase signals occurs at a terminal in the first load circuit 6a, the terminal being on a side of the first transistor 2a. Further, a voltage corresponding to the in-phase signals occurs at a terminal in the second load circuit 6b, the terminal being on a side of the second transistor 2b. Therefore, amplified in-phase signals are outputted from the first output terminal 7a and the second output terminal 7b.

In this Embodiment 2, even in a case in which noise signals are inputted as in-phase signals from the input terminals 1a and 1b, a voltage corresponding to the in-phase signals does not occur at the first input/output terminal 9b of the differential inductor 9. Further, in the same case, a voltage corresponding to the in-phase signals does not occur at the second input/output terminal 9c of the differential inductor 9. Therefore, the amplified in-phase signals can be prevented from being outputted from the first output terminal 7a and the second output terminal 7b.

As is clear from the above description, according to this Embodiment 2, a differential inductor having a center tap terminal is used as the first load circuit and the second load circuit, the center tap terminal of the differential inductor is connected to the output terminal of the current source, a first input/output terminal of the differential inductor is connected to the drain terminal of the first transistor, and a second input/output terminal of the differential inductor is connected to the drain terminal of the second transistor. Therefore, there is provided an effect of being able to increase a common-mode rejection ratio (CMRR) comparing with that in above-described Embodiment 1, in addition to the same effects as those provided by above-described Embodiment 1.

Embodiment 3

In this Embodiment 3, an example in which two current amplifiers each has the configuration shown in FIG. 1 or 3 are connected in parallel will be explained.

Figure 4:
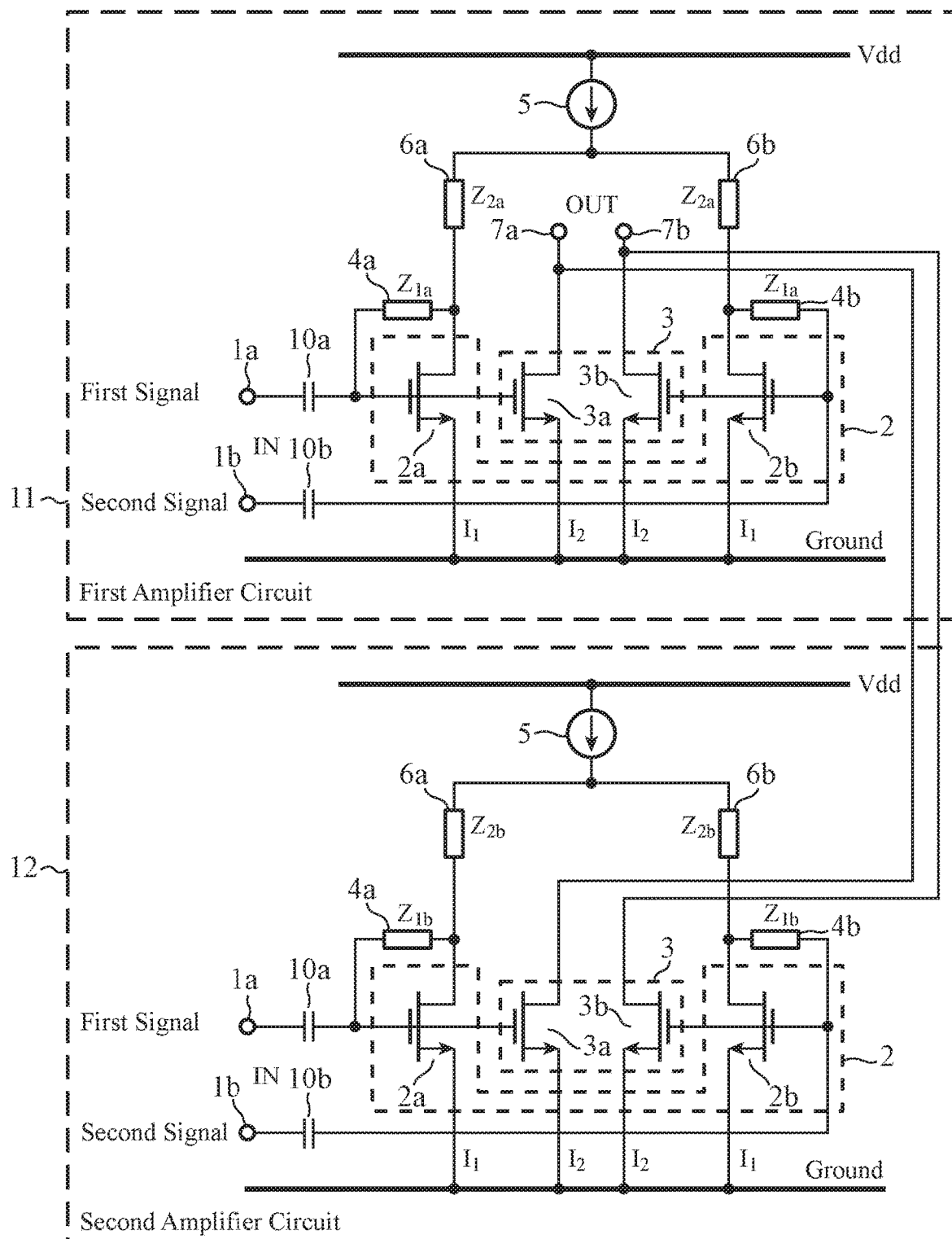
FIG. 4 is a schematic diagram showing a current amplifier according to Embodiment 3 of the present invention.

FIG. 4 is a schematic diagram showing a current amplifier according to Embodiment 3 of the present invention. In FIG. 4, the same reference characters as those shown in FIG. 1 denote the same or corresponding components.

Although an example in which two current amplifiers each has a configuration shown in FIG. 1 are connected in parallel is shown in FIG. 4, two current amplifiers each has a configuration shown in FIG. 3 may be connected in parallel.

Each of the first and second amplifier circuits 11 and 12 corresponds to the current amplifier shown in FIG. 1.

A first feedback circuit 4a and a second feedback circuit 4b in the first amplifier circuit 11 have the same role as the first feedback circuit 4a and the second feedback circuit 4b in the current amplifier of FIG. 1. To this end, the first feedback circuit 4a and the second feedback circuit 4b in the first amplifier circuit 11 have first impedance as impedance being the same characteristics, like the first feedback circuit 4a and the second feedback circuit 4b in the current amplifier of FIG. 1.

Further, a first feedback circuit 4a and a second feedback circuit 4b in the second amplifier circuit 12 have the same role as the first feedback circuit 4a and the second feedback circuit 4b in the current amplifier of FIG. 1. To this end, the first feedback circuit 4a and the second feedback circuit 4b in the second amplifier circuit 12 have first impedance as impedance being the same characteristics, like the first feedback circuit 4a and the second feedback circuit 4b in the current amplifier of FIG. 1.

However, because the first amplifier circuit 11 and the second amplifier circuit 12 have different characteristics, there is a difference between the first impedance that the first feedback circuit 4a and the second feedback circuit 4b in the first amplifier circuit 11 have, and the first impedance that the first feedback circuit 4a and the second feedback circuit 4b in the second amplifier circuit 12 have.

In the example shown in FIG. 4, the first impedance that the first feedback circuit 4a and the second feedback circuit 4b in the first amplifier circuit 11 have is $Z_{1a}$, and the first impedance that the first feedback circuit 4a and the second feedback circuit 4b in the second amplifier circuit 12 have is $Z_{1b}$.

A first load circuit 6a and a second load circuit 6b in the first amplifier circuit 11 have the same role as the first load circuit 6a and the second load circuit 6b in the current amplifier of FIG. 1. To this end, the first load circuit 6a and the second load circuit 6b in the first amplifier circuit 11 have second impedance as impedance being the same characteristics, like the first load circuit 6a and the second load circuit 6b in the current amplifier of FIG. 1.

Further, a first load circuit 6a and a second load circuit 6b in the second amplifier circuit 12 have the same role as the first load circuit 6a and the second load circuit 6b in the current amplifier of FIG. 1. To this end, the first load circuit 6a and the second load circuit 6b in the second amplifier circuit have second impedance as impedance being the same characteristics, like the first load circuit 6a and the second load circuit 6b in the current amplifier of FIG. 1.

However, because the first amplifier circuit 11 and the second amplifier circuit 12 have different characteristics, there is a difference between the second impedance that the first load circuit 6a and the second load circuit 6b in the first amplifier circuit 11 have, and the second impedance that the first load circuit 6a and the second load circuit 6b in the second amplifier circuit 12 have.

In the example shown in FIG. 4, the second impedance that the first load circuit 6a and the second load circuit 6b in the first amplifier circuit 11 is $Z_{2a}$, and the second impedance that the first load circuit 6a and the second load circuit 6b in the second amplifier circuit 12 have is $Z_{2b}$.

Next, operations will be explained.

A first signal is inputted from an input terminal 1a in the first amplifier circuit 11, and the same signal as the first signal is inputted from an input terminal 1a in the second amplifier circuit 12.

Further, a second signal is inputted from an input terminal 1b in the first amplifier circuit 11, and the same signal as the second signal is inputted from an input terminal 1b in the second amplifier circuit 12.

Thus, the first signal amplified by the first amplifier circuit 11 and the first signal amplified by the second amplifier circuit 12 are synthesized, and the amplified first signal after synthesis is outputted from a first output terminal 7a.

Further, the second signal amplified by the first amplifier circuit 11 and the second signal amplified by the second amplifier circuit 12 are synthesized, and the amplified second signal after synthesis is outputted from a second output terminal 7b.

Figure 5:
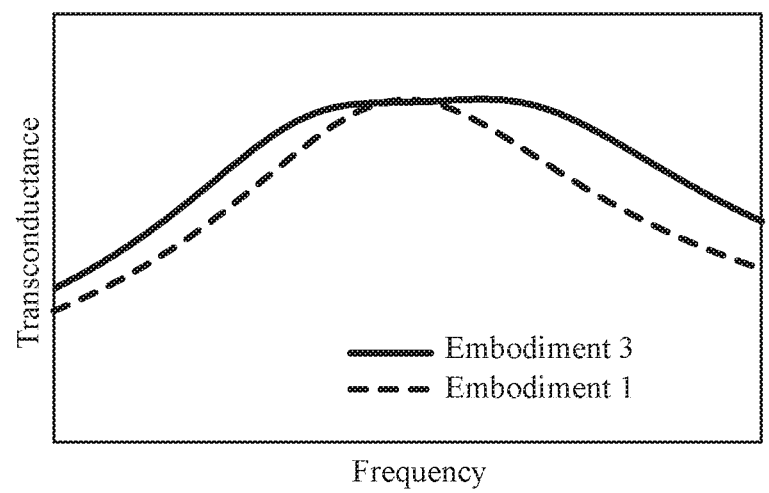
FIG. 5 is an explanatory drawing showing a frequency response of the current amplifier.

Here, FIG. 5 is an explanatory drawing showing a frequency response of the current amplifier.

In FIG. 5, a relation between the frequency and the transconductance $G_m$ in the current amplifier is shown as the frequency response of the current amplifier.

In FIG. 5, a broken line shows a case of the current amplifier of Embodiment 1, and a solid line shows a case of the current amplifier of Embodiment 3.

In this Embodiment 3, there is a difference between the first impedance that the first feedback circuit 4a and the second feedback circuit 4b in the first amplifier circuit 11 have, and the first impedance that the first feedback circuit 4a and the second feedback circuit 4b in the second amplifier circuit 12 have. Further, there is a difference between the second impedance that the first load circuit 6a and the second load circuit 6b in the first amplifier circuit 11 have, and the second impedance that the first load circuit 6a and the second load circuit 6b in the second amplifier circuit 12 have.

Therefore, there is a difference between the transconductance $G_m$ corresponding to the frequency in the first amplifier circuit 11, and the transconductance $G_m$ corresponding to the frequency in the second amplifier circuit 12.

Therefore, in the case of the current amplifier of this Embodiment 3, as shown in FIG. 5, a flat frequency response is acquired within a wider band than that in a case in which only one current amplifier is disposed like in the case of above-described Embodiment 1.

Embodiment 4

In above-described Embodiment 3, the example in which each of the first and second amplifier circuits 11 and 12 includes a current source 5 outputting a fixed output current is shown.

In this Embodiment 4, an example in which each of first and second amplifier circuits 11 and 12 includes a current source 21 outputting a variable current and a control circuit 22 controlling the current outputted from the current source 21 will be explained.

Figure 6:
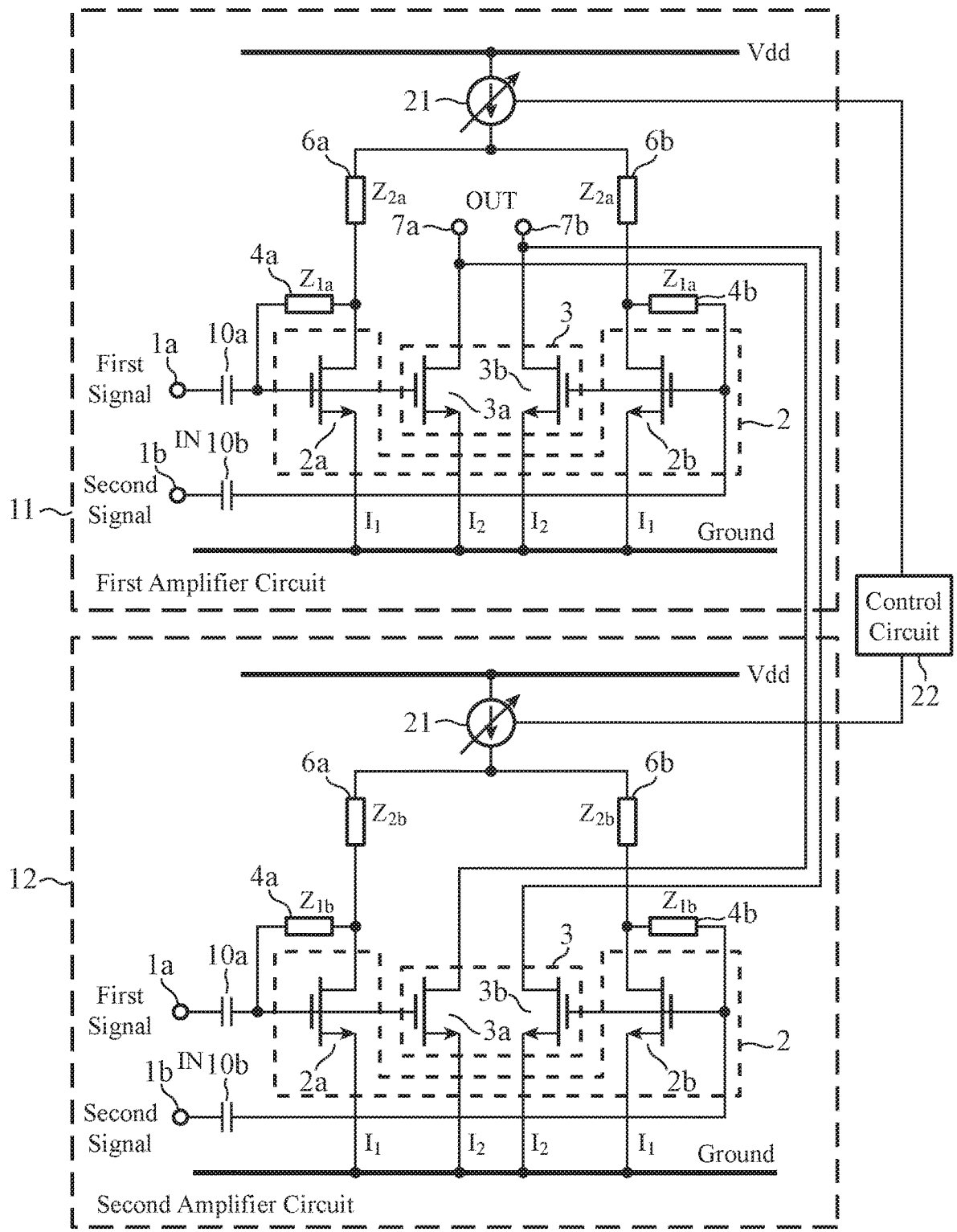
FIG. 6 is a schematic diagram showing a current amplifier according to Embodiment 4 of the present invention.

FIG. 6 is a schematic diagram showing a current amplifier according to Embodiment 4 of the present invention. In FIG. 6, the same reference characters as those shown in FIG. 4 denote the same or corresponding components.

Both the current source 21 included in the first amplifier circuit 11 and the current source 21 included in the second amplifier circuit 12 are variable current sources each having an input terminal and an output terminal. An input terminal of the current source 21 included in the first amplifier circuit 11 is connected to a power source line having a voltage $V_{dd}$ in the first amplifier circuit 11, and an output terminal of the current source 21 in the first amplifier circuit 11 is connected to both an end of a first load circuit 6a in the first amplifier circuit 11 and an end of a second load circuit 6b in the first amplifier circuit 11. An input terminal of the current source 21 included in the second amplifier circuit 12 is connected to a power source line having a voltage $V_{dd}$ in the first amplifier circuit 12, and an output terminal of the current source 21 in the second amplifier circuit 12 is connected to both an end of a first load circuit 6a in the second amplifier circuit 12 and an end of a second load circuit 6b in the second amplifier circuit 12.

The control circuit 22 controls the current outputted from the current source 21 included in the first amplifier circuit 11, and also controls the current outputted from the current source 21 included in the second amplifier circuit 12.

Figure 7:
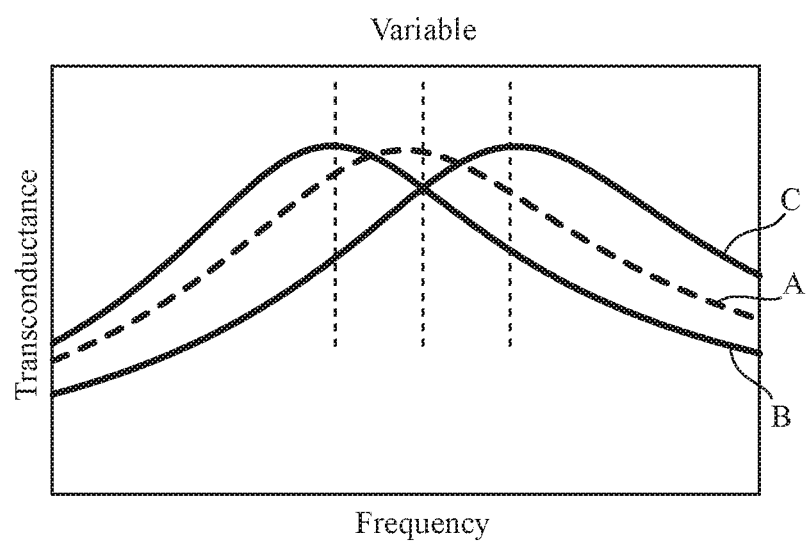
FIG. 7 is an explanatory drawing showing a frequency response of a current amplifier.

FIG. 7 is an explanatory drawing showing a frequency response of the current amplifier.

In FIG. 7, a relation between the frequency and the transconductance $G_m$ in the current amplifier is shown as the frequency response of the current amplifier.

Next, operations will be explained.

When the control circuit 22 performs control in such a way that the current outputted from the current source 21 included in the first amplifier circuit 11 and the current outputted from the current source 21 included in the second amplifier circuit 12 have the same value, the frequency response of the current amplifier represents a curve as shown by A in FIG. 7.

When the control circuit 22 performs control in such a way that the current outputted from the current source 21 included in the first amplifier circuit 11 is greater than the current outputted from the current source 21s included in the second amplifier circuit 12, the frequency response of the current amplifier represents a curve as shown by B in FIG. 7.

When the control circuit 22 performs control in such a way that the current outputted from the current source 21 included in the first amplifier circuit 11 is less than the current outputted from the current source 21 included in the second amplifier circuit 12, the frequency response of the current amplifier becomes a curve as shown by C in FIG. 7.

Therefore, by controlling the current outputted from the current source 21 included in the first amplifier circuit 11 and the current outputted from the current source 21 included in the second amplifier circuit 12 by means of the control circuit 22, the frequency response of the current amplifier can be adjusted.

Embodiment 5

Although in above-described Embodiments 1 to 4, an example in which the first transistor 2a, the second transistor 2b, the third transistor 3a, and the fourth transistor 3b are field effect transistors is shown, the first through fourth transistors are not limited to field effect transistors.

For example, the first transistor 2a, the second transistor 2b, the third transistor 3a, and the fourth transistor 3b may be bipolar transistors.

In the case in which bipolar transistors are used as the first transistor 2a, the second transistor 2b, the third transistor 3a, and the fourth transistor 3b, the base terminals of the bipolar transistors correspond to the gate terminals of the first through fourth transistors shown in above-described Embodiments 1 to 4.

Further, the emitter terminals of the bipolar transistors correspond to the source terminals of the first through fourth transistors shown in above-described Embodiments 1 to 4, and the collector terminals of the bipolar transistors correspond to the drain terminals of the first through fourth transistors shown in above-described Embodiments 1 to 4.

Also in the case in which bipolar transistors are used as the first through fourth transistors, the same effects as those provided by above-described Embodiments 1 to 4 can be achieved.

Embodiment 6

In above-described Embodiments 1 to 5, the example in which the current amplifier includes a current source 5 is shown.

In this Embodiment 6, an example in which an amplitude detector 23 is included as a current source 5 will be explained.

Figure 8:
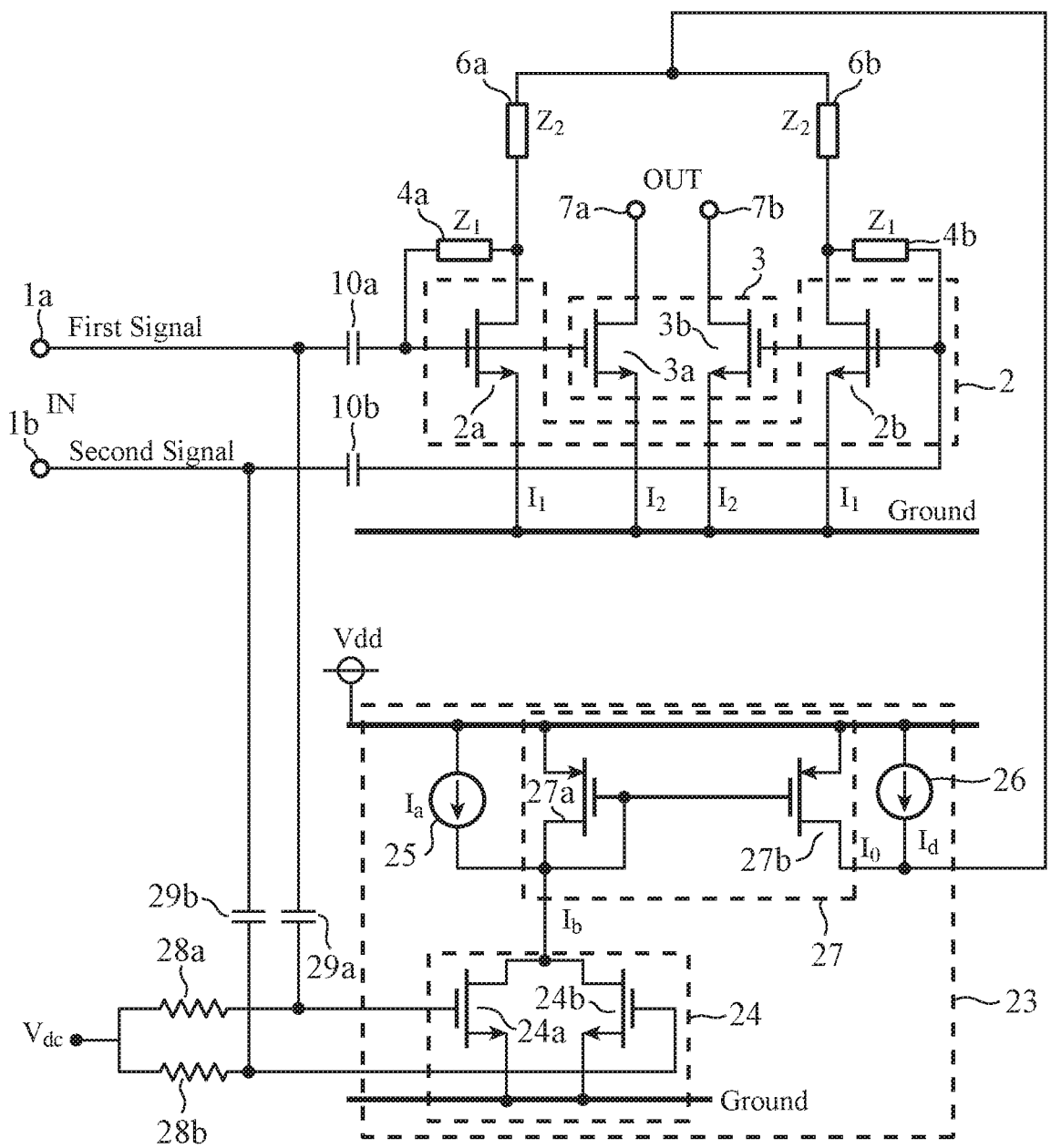
FIG. 8 is a schematic diagram showing a current amplifier according to Embodiment 6 of the present invention.

FIG. 8 is a schematic diagram showing a current amplifier according to Embodiment 6 of the present invention. In FIG. 8, the same reference characters as those shown in FIG. 1 denote the same or corresponding components, so that an explanation of the components will be omitted hereafter.

The amplitude detector 23 is a current source that includes a square-law detector circuit 24, constant current sources 25 and 26, and a current mirror circuit 27, and is a circuit that outputs a current $(I_0+I_d)$ that is the sum of a current directly proportional to the square value of the voltage amplitude of an inputted signal, and a fixed current.

The square-law detector circuit 24 includes a transistor 24a and a transistor 24b, and outputs a current $I_b$ directly proportional to the square value of the voltage amplitude $V_{IN}$ of the inputted signal.

Each of the transistors 24a and 24b is a field effect transistor such as a MOS.

A source terminal of the transistor 24a is grounded, and a signal having the voltage amplitude $V_{IN}$ is provided to a gate terminal of the transistor 24a.

A source terminal of the transistor 24b is grounded, a drain terminal of the transistor 24b is connected to a drain terminal of the transistor 24a, and a signal having the voltage amplitude $V_{IN}$ is provided to a gate terminal of the transistor 24a.

The constant current source 25 outputs a current $I_a$ that is a fixed current.

The constant current source 25 has an input terminal and an output terminal, the input terminal of the constant current source 25 is connected to a power source line $V_{dd}$, and the output terminal of the constant current source 25 is connected to the drain terminal of the transistor 24a and the drain terminal of the transistor 24b.

The constant current source 26 outputs a current $I_d$ that is a fixed current.

The constant current source 26 has an input terminal and an output terminal, the input terminal of the constant current source 26 is connected to the power source line $V_{dd}$, and the output terminal of the constant current source 26 is connected to a drain terminal of a P-channel MOS transistor 27b in the current mirror circuit 27, a first load circuit 6a, and a second load circuit 6b.

The current mirror circuit 27 includes a P-channel MOS transistor 27a and the P-channel MOS transistor 27b, and outputs a current $I_0$ on the basis of the current $I_b$ outputted from the square-law detector circuit 24 and the current $I_a$ outputted from the constant current source 25.

In the P-channel MOS transistor 27a, a source terminal is connected to the power source line $V_{dd}$, and a drain terminal and a gate terminal are connected to the output terminal of the constant current source 25, the drain terminal of the transistor 24a, and the drain terminal of the transistor 24b.

In the P-channel MOS transistor 27b, a gate terminal is connected to the gate terminal of the P-channel MOS transistor 27a, a source terminal is connected to the power source line $V_{dd}$, and the drain terminal is connected to the output terminal of the constant current source 26, the first load circuit 6a, and the second load circuit 6b.

A resistor 28a has an end connected to a power source line $V_{dc}$, and another end connected to the gate terminal of the transistor 24a.

A resistor 28b has an end connected to the power source line $V_{dc}$, and another end connected to the gate terminal of the transistor 24b.

A capacitor 29a has an end connected to an input terminal 1a, and another end connected to the gate terminal of the transistor 24a.

A capacitor 29b has an end connected to an input terminal 1b, and another end connected to the gate terminal of the transistor 24b.

Next, operations will be explained.

Because components other than the amplitude detector 23 are the same as those of above-described Embodiment 1, only an operation of the amplitude detector 23 will be explained hereafter.

Because an end of the resistor 28a is connected to the power source line $V_{dc}$, a signal having a voltage amplitude $V_{IN}$ is provided to the gate terminal of the transistor 24a of the square-law detector circuit 24.

Further, because an end of the resistor 28b is connected to the power source line $V_{dc}$, a signal having the voltage amplitude $V_{IN}$ is provided to the gate terminal of the transistor 24b of the square-law detector circuit 24.

The voltage amplitude $V_{IN}$ is a voltage that is a result obtained by subtracting a voltage drop in the resistor 28a or 28b from the voltage of the power source line $V_{dc}$.

When a signal having the voltage amplitude $V_{IN}$ is provided to the gate terminal of each of the transistors 24a and 24a, the square-law detector circuit 24 outputs a current $I_b$ directly proportional to the square value of the voltage amplitude $V_{IN}$ of the inputted signal to the current mirror circuit 27.

The current $I_b$ is represented by the following equation (3).

$$I_b = I_c + K_i V_{IN}^2 \qquad (3)$$

In equation (3), $I_c$ denotes a constant direct current included in the current $I_b$, and $K_i$ denotes a constant of proportionality.

The current mirror circuit 27 outputs a current $I_0$ as represented in the following equation (4) to the first load circuit 6a and the second load circuit 6b on the basis of the current $I_b$ outputted from the square-law detector circuit 24 and the current $I_a$ outputted from the constant current source 25.

$$I_0 = K_2((I_c - I_a) + K_1 V_{IN}^2) \qquad (4)$$

In equation (4), $K_2$ denotes a mirror ratio of the current mirror circuit 27.

Then, a current that is the sum of the current $I_0$ outputted from the current mirror circuit 27 and the current $I_d$ outputted from the constant current source 25 is outputted to the first load circuit 6a and the second load circuit 6b.

As a result, a current $I_1$ flowing between a drain and a source in each of first and second transistors 2a and 2b is represented by the following equation (5).

$$I_1 = I_0 + I_d = K_2(I_c - I_a) + I_d + K_1 K_2 V_{IN}^2 \qquad (5)$$

Hereafter, some effects of this Embodiment 6 will be explained.

In a region in which the voltage amplitude $V_{IN}$ of the input signal is small, the current $I_0$ outputted from the amplitude detector 23 is small, and the current $I_1$ flowing between the drain and the source in each of the first and second transistors 2a and 2b is also small.

For example, signals recently used for mobile communications and so on are ones on which multi-level modulation is performed, and there is a tendency that their peak to average power ratios are large. In a case in which the current amplifier is used for such applications, the average current consumption can be reduced.

Figure 9:
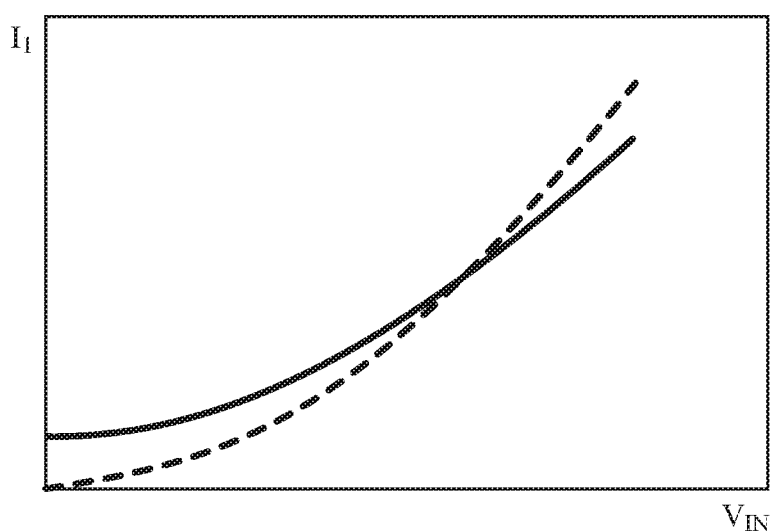
FIG. 9 is an explanatory drawing showing a relation between a voltage amplitude $V_{IN}$ of an input signal in an amplitude detector 23, and a current $I_1$.
Figure 10:
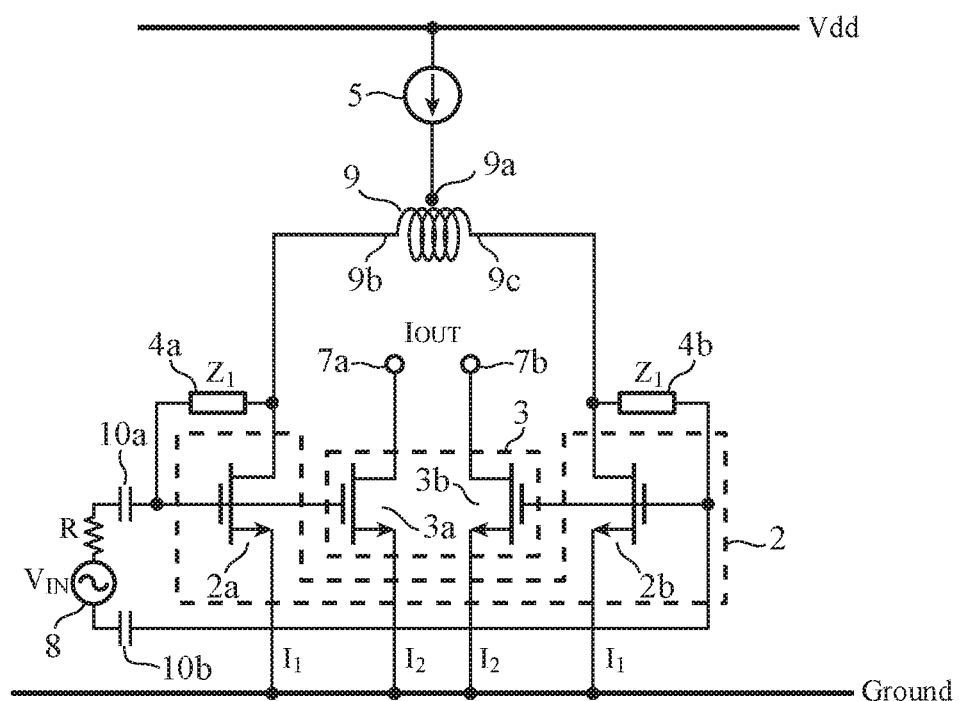
FIG. 10 illustrates FIG. 2 including a load circuit that is a differential inductor.
Figure 11:
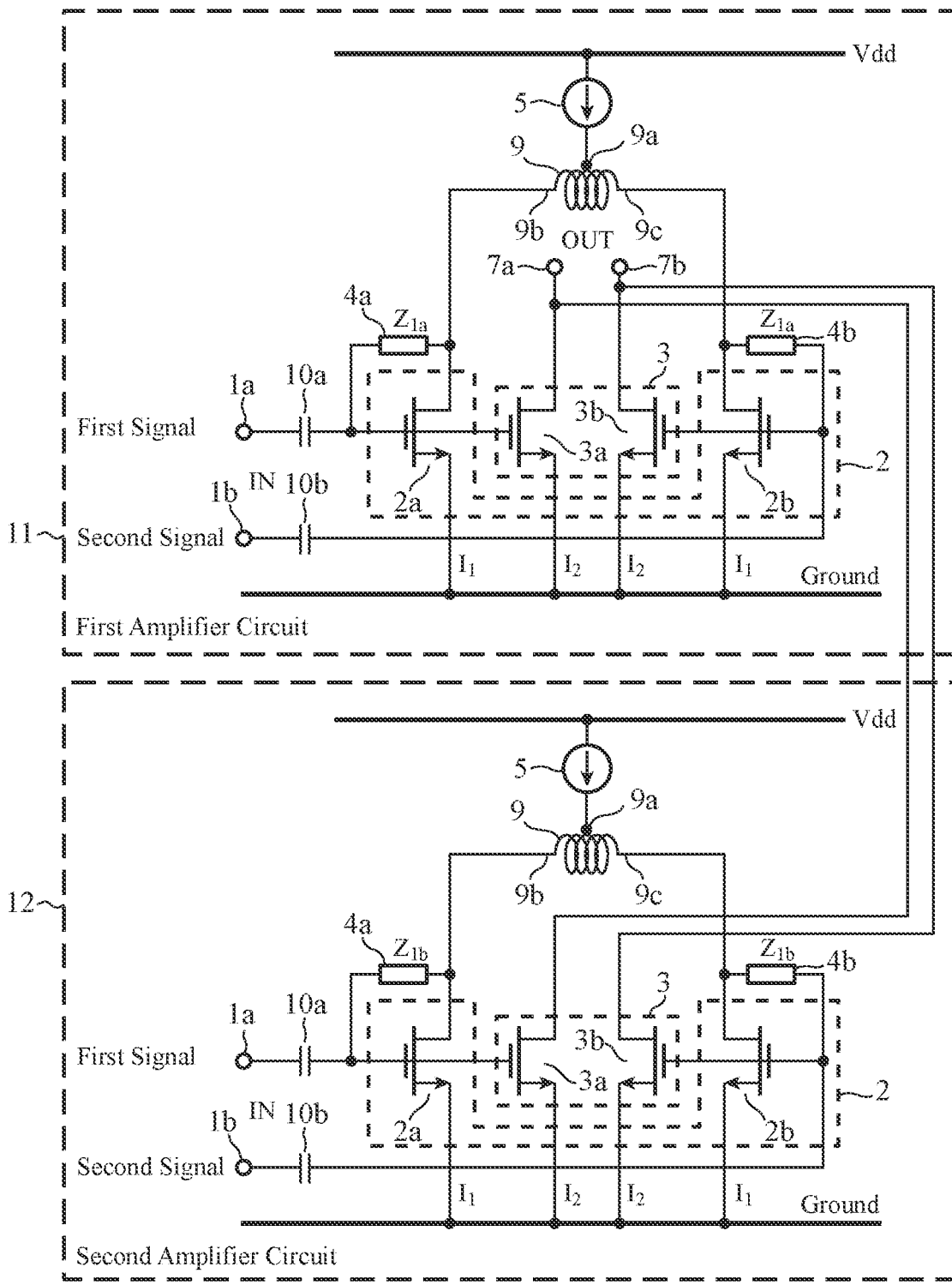
FIG. 11 illustrates FIG. 4 including a load circuit that is a differential inductor.
Figure 12:
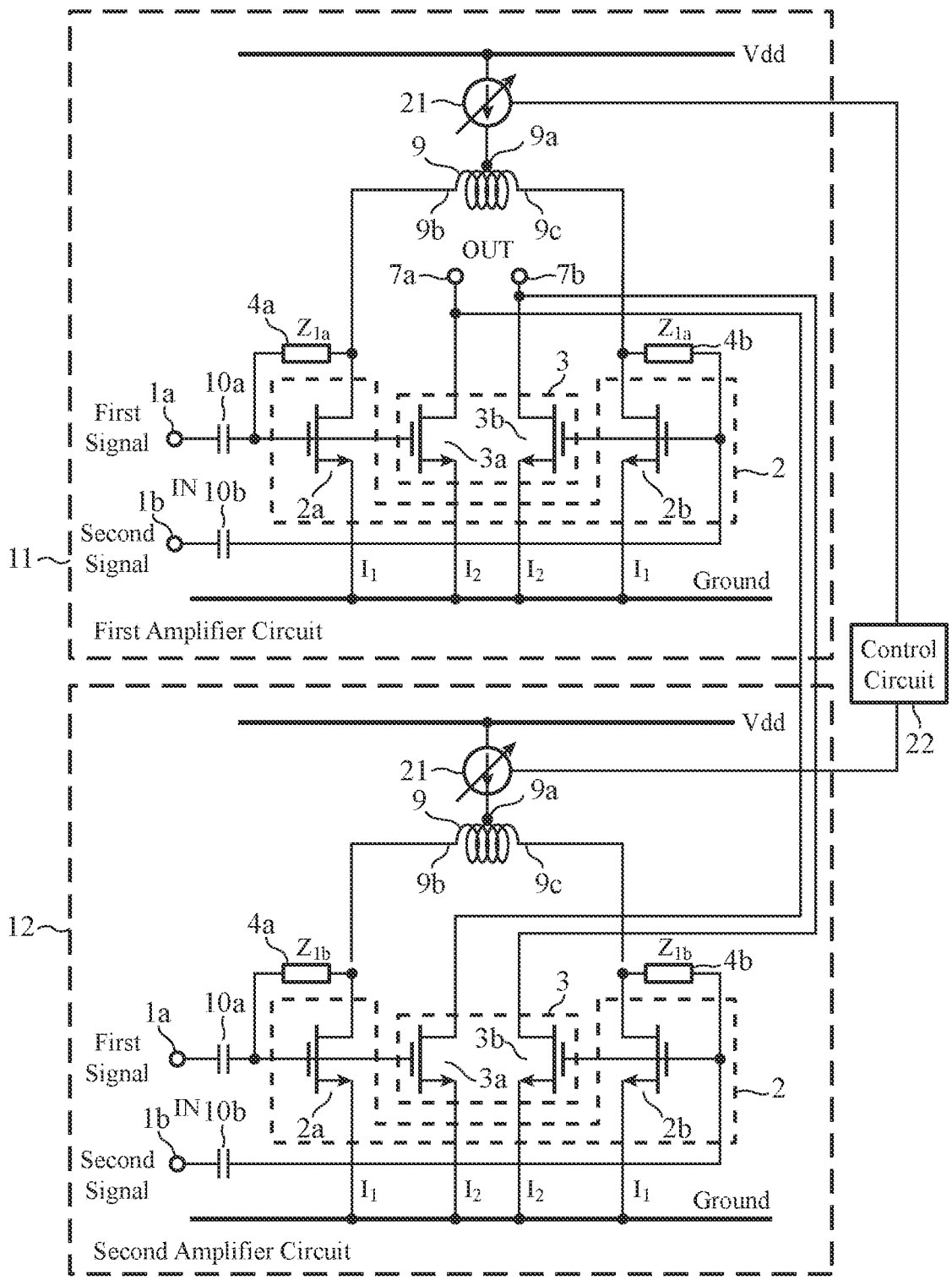
FIG. 12 illustrates FIG. 6 including a load circuit that is a differential inductor.
Figure 13:
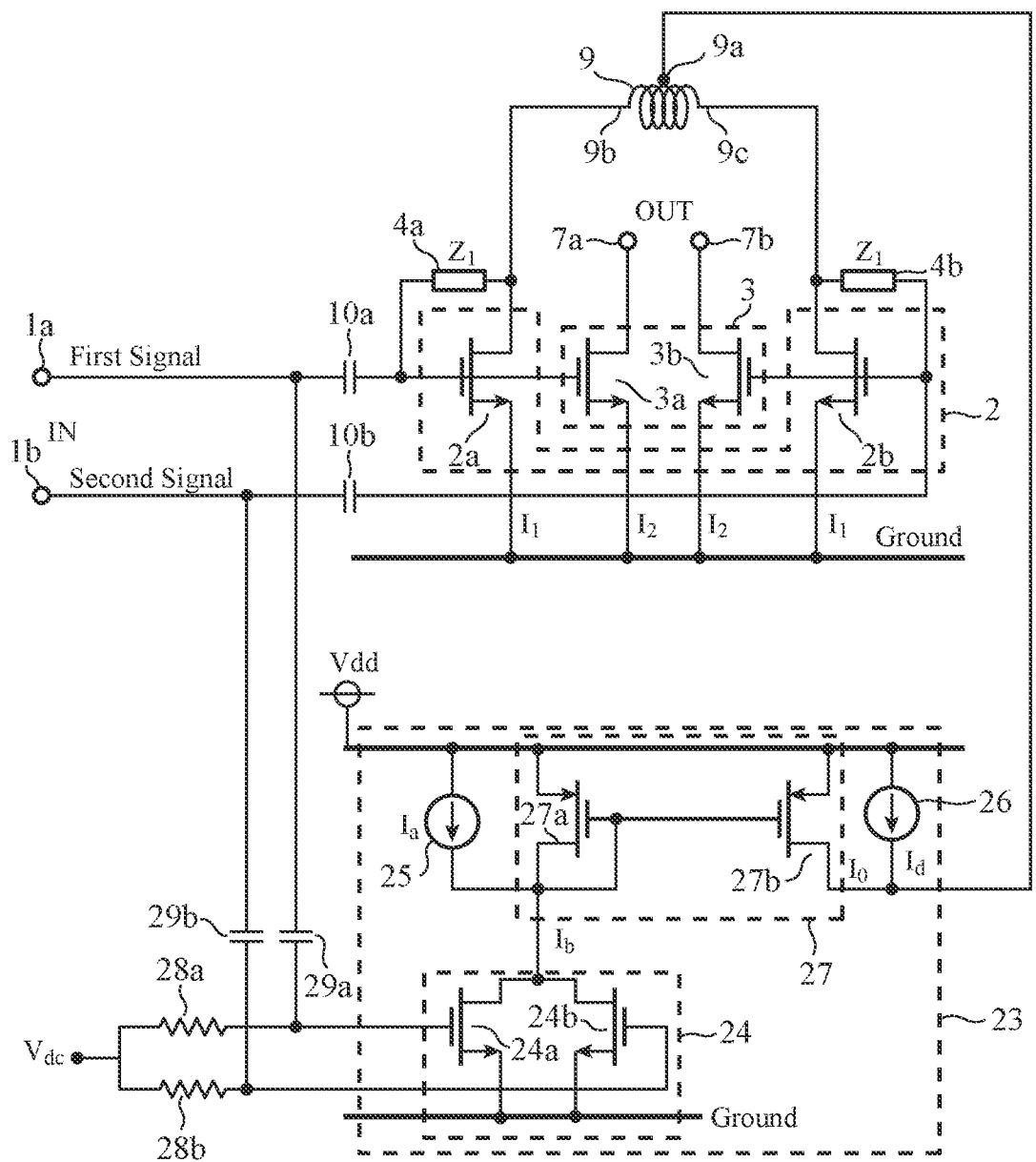
FIG. 13 illustrates FIG. 8 including a load circuit that is a differential inductor.

By adjusting the current $I_a$, the current $I_d$, and the mirror ratio $K_2$, the inclination of the current $I_1$ with respect to the voltage amplitude $V_{IN}$ of the input signal can be changed, as shown in FIG. 9.

FIG. 9 is an explanatory drawing showing relations between the voltage amplitude $V_{IN}$ of the input signal and the current $I_1$ in the amplitude detector 23.

In an example of FIG. 9, characteristics expressed by a solid line and characteristics expressed by a broken line are represented as two characteristics that the inclination of the current $I_1$ with respect to the voltage amplitude $V_{IN}$ of the input signal differs.

It is to be understood that any combination of two or more of the above-described embodiments can be made, various changes can be made in any component according to any one of the above-described embodiments, and any component according to any one of the above-described embodiments can be omitted within the scope of the present invention.

INDUSTRIAL APPLICABILITY

The present invention is suitable for a current amplifier having multiple transistors.

REFERENCE SIGNS LIST 1a, 1b input terminal, 2 first differential pair, 2a first transistor, 2b second transistor, 3 second differential pair, 3a third transistor, 3b fourth transistor, 4a first feedback circuit, 4b second feedback circuit, 5 current source, 6a first load circuit, 6b second load circuit, 7a first output terminal, 7b second output terminal, 8 input signal source, 9 differential inductor, 9a center tap terminal, 9b first input/output terminal, 9c second input/output terminal, 10a, 10b capacitor, 11 first amplifier circuit, 12 second amplifier circuit, 21 current source, 22 control circuit, 23 amplitude detector, 24 square-law detector circuit, 24a, 24b transistor, 25, 26 constant current source, 27 current mirror circuit, 27a, 27b P-channel MOS transistor, 28a, 28b resistor, and 29a, 29b capacitor.

The invention claimed is:

1. A current amplifier comprising:
a first transistor whose source terminal is grounded and whose gate terminal is configured to receive a first signal;
a second transistor whose source terminal is grounded and whose gate terminal is configured to receive a second signal, the first signal and the second signal mutually constituting a differential signal;
a third transistor whose source terminal is grounded, whose drain terminal is connected to a first output terminal, and whose gate terminal is configured to receive the first signal;
a fourth transistor whose source terminal is grounded, whose drain terminal is connected to a second output terminal, and whose gate terminal is configured to receive the second signal;
a first feedback circuit connected between the gate terminal and a drain terminal which are included in the first transistor, and having first impedance;
a second feedback circuit connected between the gate terminal and a drain terminal which are included in the second transistor, and having the first impedance;
a current source outputting a current;
a first load circuit connected between the drain terminal of the first transistor and an output terminal of the current source, and having second impedance; and
a second load circuit connected between the drain terminal of the second transistor and the output terminal of the current source, and having the second impedance, wherein a differential inductor having a center tap terminal is used as the first load circuit and the second load circuit,
the center tap terminal of the differential inductor is connected to the output terminal of the current source,
a first input/output terminal of the differential inductor is connected to the drain terminal of the first transistor, and a second input/output terminal of the differential inductor is connected to the drain terminal of the second transistor.

2. The current amplifier according to claim 1, wherein a first amplifier circuit including the first through the fourth transistors, the first and second feedback circuits, the current source, and the first and second load circuits, and a second amplifier circuit including the first through fourth transistors, the first and second feedback circuits, the current source, and the first and second load circuits that are different from those included in the first amplifier circuit, are connected in parallel, and
the first impedance that the first and second feedback circuits included in the first amplifier circuit have differs from the first impedance that the first and second feedback circuits included in the second amplifier circuit have, and the second impedance that the first and second load circuits included in the first amplifier circuit have differs from the second impedance that the first and second load circuits included in the second amplifier circuit have.

3. The current amplifier according to claim/further comprising a control circuit controlling both the current outputted from the current source included in the first amplifier circuit and the current outputted from the current source included in the second amplifier circuit.

4. The current amplifier according to claim 1, wherein each of the first through fourth transistors is a field effect transistor.

5. The current amplifier according to claim 1, wherein each of the first through fourth transistors is a bipolar transistor,
a base terminal of the bipolar transistor is the gate terminal,
an emitter terminal of the bipolar transistor is the source terminal, and
a collector terminal of the bipolar transistor is the drain terminal.

6. The current amplifier according to claim 1, wherein the current source outputs the current that is a sum of a current directly proportional to a square value of a voltage amplitude of an inputted signal, and a fixed current.

* * * * *